United States Patent
Matsui et al.

(10) Patent No.: US 8,475,602 B2
(45) Date of Patent: Jul. 2, 2013

(54) SUBSTRATE CLEANING METHOD AND APPARATUS

(75) Inventors: Hidefumi Matsui, Nirasaki (JP); Tsuyoshi Moriya, Nirasaki (JP)

(73) Assignee: Toyko Electron Limited, Tokyo (JP)

( * ) Notice: Subject to any disclaimer, the term of this patent is extended or adjusted under 35 U.S.C. 154(b) by 347 days.

(21) Appl. No.: 12/604,686

(22) Filed: Oct. 23, 2009

(65) Prior Publication Data

US 2010/0101608 A1 Apr. 29, 2010

(30) Foreign Application Priority Data

Oct. 27, 2008 (JP) ................................. 2008-276027

(51) Int. Cl.
*B08B 6/00* (2006.01)
*B08B 11/00* (2006.01)

(52) U.S. Cl.
USPC .............................. 134/19; 134/1.3; 134/902

(58) Field of Classification Search
USPC ........................................... 134/1.3, 19, 105
See application file for complete search history.

(56) References Cited

U.S. PATENT DOCUMENTS

| | | | |
|---|---|---|---|
| 6,205,676 B1* | 3/2001 | Fujii et al. | 34/250 |
| 6,430,324 B1* | 8/2002 | Muramatsu et al. | 385/12 |
| 6,566,169 B1* | 5/2003 | Uziel et al. | 438/115 |
| 2002/0023902 A1* | 2/2002 | Allen | 219/121.66 |
| 2002/0029956 A1* | 3/2002 | Allen | 204/157.15 |
| 2005/0082000 A1* | 4/2005 | Moriya et al. | 156/345.28 |
| 2005/0241770 A1* | 11/2005 | Moriya et al. | 156/345.51 |

FOREIGN PATENT DOCUMENTS

| | | |
|---|---|---|
| CN | 1691288 A | 11/2005 |
| CN | 1931453 A | 3/2007 |
| CN | 1961258 A | 5/2007 |
| CN | 101006198 A | 7/2007 |
| JP | 3-82020 | 4/1991 |
| JP | 11-26411 | 1/1999 |
| JP | 2003-45334 | 2/2003 |
| JP | 2005-33128 | 2/2005 |
| JP | 2005-101539 | 4/2005 |
| JP | 2006-147654 | 6/2006 |
| JP | 2007-165699 | 6/2007 |
| JP | 2008-41873 | 2/2008 |
| KR | 10-2007-0058337 | 6/2007 |
| KR | 10-2007-0067246 | 6/2007 |
| KR | 10-2007-0078264 | 7/2007 |
| WO | WO 2005116758 A2 * | 12/2005 |

OTHER PUBLICATIONS

Machine translation of KR-10-2007-0058337; Yonemijeu Akkira; Jun. 2007.*
Office Action issued May 25, 2011, in Chinese Patent Application No. 200910207039.X (with English-language translation).
Office Action issued Apr. 19, 2011 in Korea Application No. 10-2009-0102320 (With English Translation).
Office Action issued Jan. 8, 2013 in Japanese Application No. 2008-276027.

\* cited by examiner

*Primary Examiner* — Michael Kornakov
*Assistant Examiner* — Natasha Campbell
(74) *Attorney, Agent, or Firm* — Oblon, Spivak, McClelland, Maier & Neustadt, L.L.P.

(57) ABSTRACT

A substrate cleaning method for cleaning and removing foreign materials adhered to a surface of a substrate includes heating the substrate to peel off the foreign materials from the surface of the substrate by a thermal stress, removing the foreign materials from the surface of the substrate by a temperature gradient created in a proximity of the surface of the substrate, and collecting the foreign materials removed from the surface of the substrate by a collecting unit facing the substrate.

14 Claims, 6 Drawing Sheets

SUBSTRATE CLEANING METHOD AND APPARATUS

FIELD OF THE INVENTION

The present invention relates to a substrate cleaning method and apparatus; and more particularly, to a dry type substrate cleaning method and apparatus capable of removing foreign materials, by-products, an unnecessary film and the like adhered to a surface of a substrate after an etching process or a film forming process.

BACKGROUND OF THE INVENTION

As a cleaning method of a surface of a substrate such as a semiconductor wafer, for example, a wet type substrate cleaning method is commonly used. In the wet type substrate cleaning method, foreign materials are removed by immersing a target substrate in a solution or solvent, or by spraying a solution or solvent to the substrate. Then, the substrate is rinsed with pure water, if necessary.

In the wet type substrate cleaning method, the solution residues or solvent residues remaining on the surface of the substrate after cleaning may cause water marks, surface oxidation, and the like. Accordingly, for example, the solution residues, the pure water residues, and the like are dried and removed by performing a spin dry process after the immersion or spray cleaning process.

For example, Japanese Patent Publication No. 2008-41873 discloses a conventional substrate cleaning method including, a first step of cleaning a surface of a substrate with a liquid chemical, a second step of substituting pure water for liquid chemical residues remaining on the surface of the substrate, a third step of treating the surface of the substrate with hot pure water having a temperature higher than that of the pure water used in the second step, a fourth step of cooling the substrate to a temperature lower than that of the hot pure water, and a fifth step of drying the substrate after cooling.

However, in the wet type substrate cleaning method using the liquid chemical, when the liquid including the liquid chemical is volatilized in the dry process after cleaning, a pattern formed on the surface of the substrate collapses due to gas-liquid interface tension. Specially, when the dry process uses sublimation of dry ice such as Ar and $CO_2$, the pattern collapse gets more serious.

Further, pattern collapse occurs in even a pattern having a size of 70 to 60 nm, and it may be very difficult to prevent a pattern having a size of about 20 nm and an aspect ratio of about 10 from collapsing after wet cleaning. In case of a target substrate having a so-called low-k film, liquid may infiltrate into a porous portion of the low-k film and it is difficult to completely remove the liquid that has already infiltrated into the porous portion. Accordingly, it is preferable to avoid adopting the wet type substrate cleaning method.

SUMMARY OF THE INVENTION

In view of the above, the present invention provides a substrate cleaning method and apparatus without pattern collapse.

In accordance with a first aspect of the present invention, there is provided a substrate cleaning method for cleaning and removing foreign materials adhered to a surface of a substrate, the method comprising: heating the substrate to peel off the foreign materials from the surface of the substrate by a thermal stress; removing the foreign materials from the surface of the substrate by a temperature gradient created in a proximity of the surface of the substrate; and collecting the foreign materials removed from the surface of the substrate by a collecting unit facing the substrate.

In accordance with a second aspect of the present invention, there is provided a substrate cleaning apparatus for cleaning and removing foreign materials adhered to a surface of a substrate, the apparatus comprising: a mounting table, on which the substrate is mounted; a heating unit for heating the substrate mounted on the mounting table to peel off the foreign materials from the surface of the surface by a thermal stress and to remove the foreign materials from the surface of the surface by a thermophoretic force; and a foreign material collecting unit which is arranged to face the mounting table and collects the foreign materials removed from the surface of the substrate.

BRIEF DESCRIPTION OF THE DRAWINGS

The objects and features of the present invention will get apparent from the following description of embodiments, given in conjunction with the accompanying drawings, in which.

DETAILED DESCRIPTION OF THE EMBODIMENTS

The embodiments of the present invention will be described with reference to the accompanying drawings which form a part hereof. Throughout the specification and drawings, like reference numerals will be given to like parts having substantially the same function and configuration, and redundant description thereof will be omitted.

Figure 1:
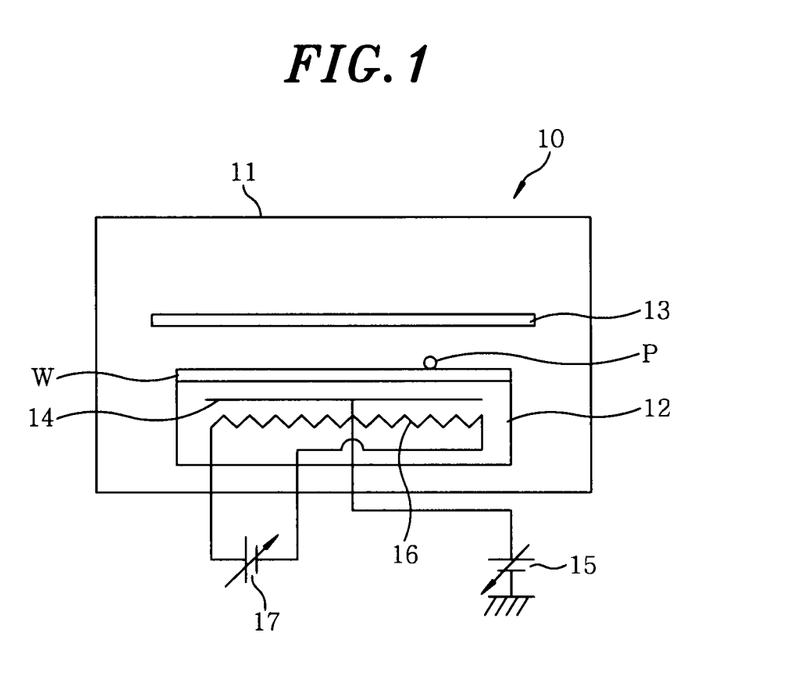
FIG. 1 shows a schematic configuration of a substrate cleaning apparatus in accordance with a first embodiment of the present invention.

FIG. 1 shows a schematic configuration of a substrate cleaning apparatus in accordance with a first embodiment of the present invention. As shown in FIG. 1, a substrate cleaning apparatus 10 includes a processing chamber 11, a mounting table 12 provided at a bottom portion of the processing chamber 11, and a collecting plate 13 serving as a foreign material collecting unit separated from a substrate mounting surface of the mounting table 12 by a predetermined distance. A substrate to be processed, e.g., a semiconductor wafer W is mounted on the mounting table 12, and the mounting table 12 supports the wafer W. An electrostatic electrode plate 14 which attracts the wafer W by a Coulomb force or a Johnsen-Rahbek force is embedded in the mounting table 12, and the electrostatic electrode plate is connected to a DC power supply 15. Further, a heat transfer heater 16 serving as a heating unit for heating the wafer W is embedded in the mounting table 12, and the heat transfer heater 16 is connected to, e.g., a DC power supply 17.

In the substrate cleaning apparatus 10 having the above-described configuration, the wafer W serving as a target substrate is mounted on an upper surface of the mounting table 12, and an inner pressure of the processing chamber 11 is adjusted from $1.3 \times 10^2$ Pa (1 Torr) to 6.6 kPa (50 Torr), e.g., 1.3 kPa (10 Torr), by a pressure control unit (not shown). Then, when the wafer W is heated to about an upper limit of the heat resistant temperature, e.g., 150° C., a thermal stress and a thermophoretic force are applied to foreign materials (hereinafter, referred to as "particles P") adhered to the surface of the wafer W, and the particles P are peeled off and removed from the surface of the wafer W.

That is, when the wafer W is heated to 150° C., the particles P are peeled off from the wafer W by the thermal stress. Further, since the collecting plate 13 facing the mounting table 12 is not heated, a temperature difference between the surface of the wafer W and the collecting plate increases, thereby generating a temperature gradient in an atmosphere surrounding the particles P adhered to the wafer W. Due to the temperature gradient, a thermophoretic force acting from the surface of the wafer W having a high temperature toward the collecting plate 13 having a low temperature is applied to the particles P peeled off from the surface of the wafer W. Accordingly, the particles P are removed from the surface of the wafer W, moved toward the collecting plate 13, and captured by the collecting plate 13.

The thermophoretic force can be defined as follows. In case that a large temperature gradient exists in a space including particles, gas molecules colliding with the particles have higher momentum in a high temperature region rather than in a low temperature region. Accordingly, the particles are affected by a force acting from the high temperature region toward the low temperature region, and such force applied to the particles is defined as the thermophoretic force.

In accordance with the first embodiment of the present invention, the thermal stress and the thermophoretic force are applied to the particles P adhered to the surface of the wafer W by heating the wafer W. Accordingly, the particles P are peeled off and removed from the surface of the wafer W. Then, the particles P are captured by the collecting plate 13 facing the mounting table 12. Therefore, the particles P adhered to the surface of the wafer W can be cleaned and removed without using a cleaning liquid. Further, a gas-liquid interface tension is not generated and, thus, pattern collapse caused by the gas-liquid interface tension can be also prevented.

Further, since a dry cleaning method is employed without using the cleaning liquid, even though the substrate has narrow patterns of, e.g., 20 nm or less, the particles P adhered to the surface of the substrate and grooves of the pattern can be effectively cleaned and removed without causing pattern collapse.

In this embodiment, it is preferable that the surface of the wafer W has a high temperature, and a maximum processing temperature may be determined depending on the heat resistant temperature of the wafer W. For example, in case of the wafer W having a photoresist film, since the heat resistant temperature of the wafer W is about 150° C., it is preferable that the maximum processing temperature is set to the highest temperature in this case. Similarly, in case of cleaning the substrate having its heat resistant temperature of 200° C., it is preferable to set the surface temperature of the substrate to, e.g., 200° C.

In the embodiment of the present invention, heating of the wafer W is not for vaporizing the particles P (foreign materials) adhered to the substrate, as commonly executed. The heating temperature is set to be lower than the vaporization point of the particles P.

In this embodiment, it is preferable that the inner pressure of the processing chamber 11 ranges from about $1.3 \times 10^2$ Pa (1 Torr) to 6.6 kPa (50 Torr), and is set to, e.g., 1.3 kPa (10 Torr). There exists an optimum pressure range in the dry cleaning method of the wafer W using the thermophoretic force. If the inner pressure of the processing chamber 11 is lower than about $1.3 \times 10^2$ Pa (1 Torr), the temperature gradient decreases and, thus, the thermophoretic force decreases. If the inner pressure of the processing chamber 11 is higher than about 6.6 kPa (50 Torr), gas density increases and, thus, the thermophoretic force decreases. If the inner pressure of the processing chamber 11 ranges from about $1.3 \times 10^2$ Pa (1 Torr) to 6.6 kPa (50 Torr), the thermophoretic force is relatively strong and, thus, the particles P can be efficiently cleaned and removed. Further, when the inner pressure of the processing chamber 11 is an atmospheric pressure, it is possible to clean the substrate even though a small thermophoretic force is applied to the particles P.

In this embodiment, the collecting plate 13 may be a flat plate made of, e.g., $Y_2O_3$, quartz, polytetrafluoroethylene (product name: Teflon (registered trademark)), Si, Al, $Al_2O_3$, $SiO_2$, or the like and having a thickness of about 0.5 to 10 mm.

The substrate cleaning apparatus of this embodiment can be independently installed and operated without using another device. In this case, a particle map indicating locations of the particles may be prepared by using a particle inspection apparatus such as a surf scan, and pin point cleaning may be executed by using the data of the particle map.

Further, the substrate cleaning apparatus in accordance with the embodiment of the present invention may be provided in a load-lock module, or in the proximity of a process module of a substrate processing system.

Figure 2:
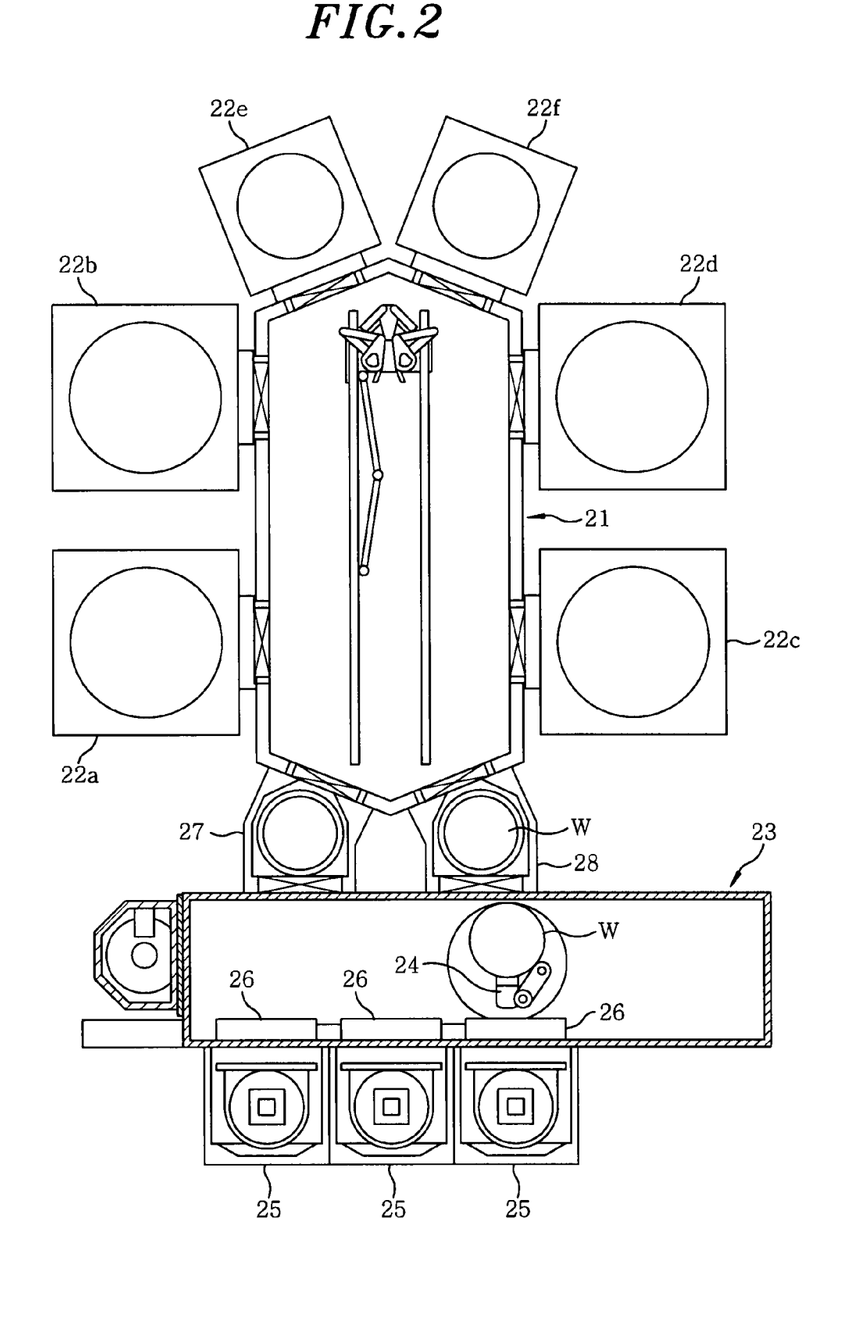
FIG. 2 shows a schematic configuration of an example of a substrate processing system.

FIG. 2 shows a schematic configuration of an example of a substrate processing system. As shown in FIG. 2, the substrate processing system includes a hexagonal transfer module 21, a plurality of process modules 22a to 22f arranged at an outer peripheral portion of the transfer module 21, a loader module 23 serving as a rectangular transfer chamber annexed to the transfer module 21, a transfer arm 24 provided in the loader module 23, load ports 26 respectively arranged in connecting portions of the loader module 23 and FOUP mounting tables 25, and load-lock modules 27 and 28 provided between the transfer module 21 and the loader module 23 to connect the modules 21 and 23. The substrate cleaning apparatus in accordance with the embodiment of the present invention may be provided in the load-lock modules 27 and 28, or in the proximity of the process modules 22a to 22f of the substrate processing system. In this case, a cleaning operation of the substrate can be executed in connection with the function of each module.

Further, in case that the substrate cleaning apparatus in accordance with the embodiment of the present invention is provided in the load-lock modules 27 and 28, existing members, e.g., a mounting table, which are provided in the load-lock modules 27 and 28, may be used without repeatedly installing the same member.

Next, a second embodiment of the present invention will be now described.

Figure 3:
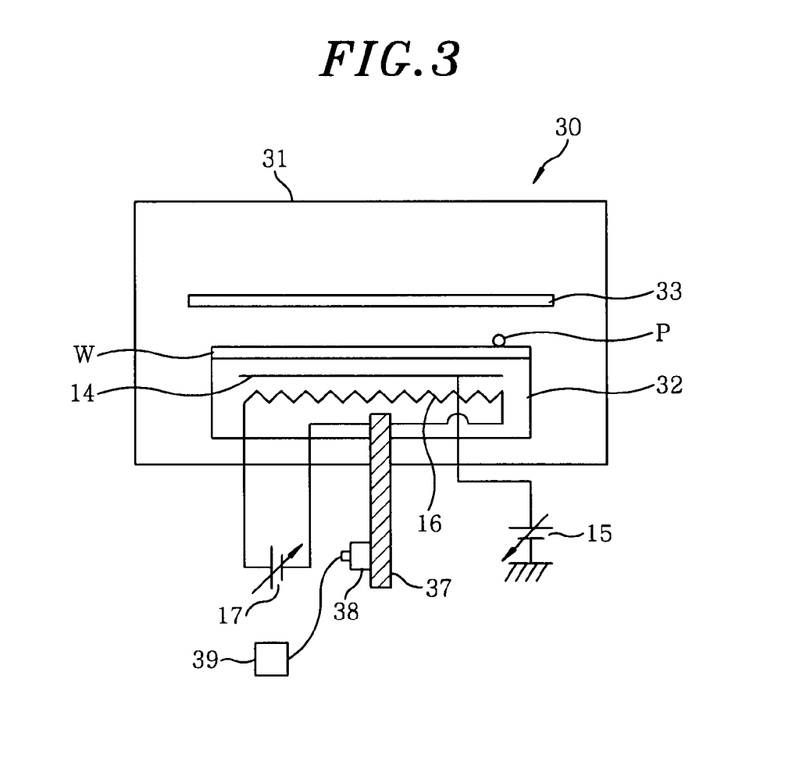
FIG. 3 shows a schematic configuration of a substrate cleaning apparatus in accordance with a second embodiment of the present invention.

FIG. 3 shows a schematic configuration of a substrate cleaning apparatus in accordance with the second embodiment of the present invention. As shown in FIG. 3, a substrate cleaning apparatus 30 is different from the substrate cleaning apparatus 10 shown in FIG. 1 in that the substrate cleaning apparatus 30 includes a heating/vibrating mounting table 32, which is connected to a rod-shaped member (hereinafter, referred to as a "pole") 37 to which an ultrasonic oscillator 38 is attached. The ultrasonic oscillator 38 is electrically connected to a power supply 39.

In the substrate cleaning apparatus 30 having the above-described configuration, the wafer W serving as a target substrate is mounted on an upper surface of the heating/vibrating mounting table 32 and an inner pressure of a processing chamber 31 is adjusted to, e.g., 1.3 kPa (10 Torr). Then, the wafer W is heated to, e.g., 150° C. by a heat transfer heater 16, and is subjected to micro-vibration by the ultrasonic oscillator 38, thereby peeling off and removing the particles P. The removed particles P are collected by a collecting plate 33.

In accordance with the second embodiment of the present invention, a vibrating step using the ultrasonic oscillator 38 and a heating step are performed at the same time. Accordingly, adhesive strength of the particles P adhered to the surface of the wafer W becomes weaker than that of the first embodiment of the present invention in which only a heating step is performed. Accordingly, the particles P can be more easily removed from the surface of the wafer W, and cleaning efficiency can be improved. The frequency of ultrasonic waves generated by the ultrasonic oscillator 38 ranges, e.g., from 1 to 100 kHz.

Next, a third embodiment of the present invention will be now described.

Figure 4:
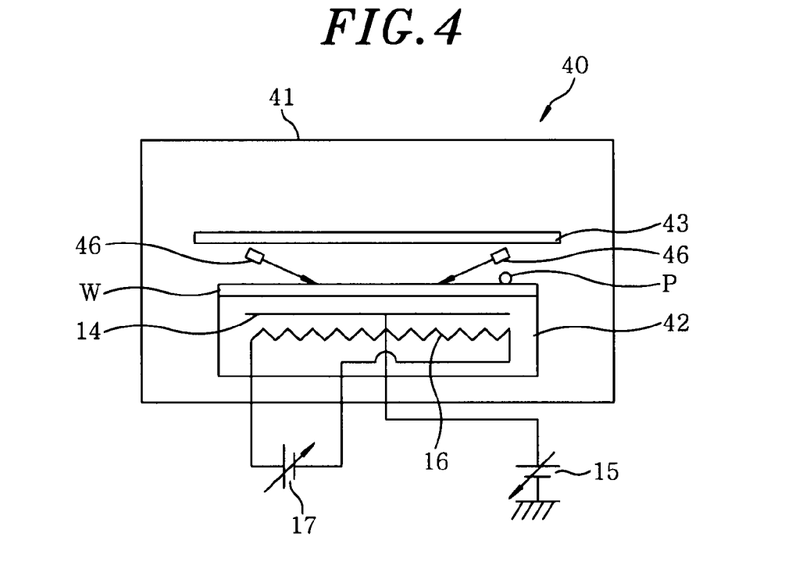
FIG. 4 shows a schematic configuration of a substrate cleaning apparatus in accordance with a third embodiment of the present invention.

FIG. 4 shows a schematic configuration of a substrate cleaning apparatus in accordance with a third embodiment of the present invention. As shown in FIG. 4, a substrate cleaning apparatus 40 is different from the substrate cleaning apparatus 10 shown in FIG. 1 in that the substrate cleaning apparatus 40 includes a light source 46 for irradiating light having a specific wavelength to the surface of the wafer W mounted on a substrate mounting surface of the a mounting table 42.

In the substrate cleaning apparatus 40 having the above-described configuration, the wafer W serving as a target substrate is mounted on an upper surface of the mounting table 42, and an inner pressure of a processing chamber 41 is adjusted to, e.g., 1.3 kPa (10 Torr). Then, the wafer W is heated to, e.g., 150° C. by a heat transfer heater 16. For example, ultraviolet (UV) light having a wavelength of about 300 nm or less, or infrared (IR) light having a wavelength of about 800 nm or more is irradiated on the surface of the wafer W by the light source 46. Accordingly, the particles P are subjected to micro-vibration by the irradiated light, and peeled off and removed. The removed particles P are collected by a collecting plate 43.

In accordance with the third embodiment of the third embodiment of the present invention, the particles P are subjected to micro-vibration by the light irradiated to the particles P adhered to the surface of the wafer W. Accordingly, adhesive strength of the particles P to the surface of the wafer W is reduced. Therefore, the particles P can be more easily removed from the surface of the wafer W, and cleaning efficiency of the wafer W and collecting efficiency can be improved compared to, e.g., the first embodiment of the present invention.

In the third embodiment of the present invention, infrared laser beam may be irradiated to the particles P adhered to the surface of the wafer W from the light source 46. In case of irradiating the infrared laser beam, a thermal stress due to heating and expansion is applied to the particles P or the wafer W. Thus, the particles P can be more easily peeled off from the wafer W. Further, if there is moisture between the particles P and the wafer W, the particles P can be more easily peeled off from the wafer W due to explosion of moisture. The particles P peeled off from the surface of the wafer W are collected by the collecting plate 43.

Additionally, in the third embodiment of the present invention, UV light or electromagnetic waves may be irradiated on the surface of the wafer W from the light source 46 to supply energy thereto. Accordingly, the particles P can be more easily peeled off. That is, in case of irradiating UV light having relatively low energy on the particles P adhered to the surface of the wafer W, the particles P are vibrated and adhesive strength of the particles P to the wafer W becomes weaker. Thus, the particles P can rise from the surface of the wafer W and be more easily removed. Meanwhile, in case of irradiating electromagnetic waves having relatively high energy, e.g., having a wavelength of about 100 nm or less on the particles P adhered to the surface of the wafer W, high vibration energy is supplied to the particles P or the wafer W. Accordingly, the particles P can be peeled off from the wafer W. The particles P peeled off from the surface of the wafer W are collected by the collecting plate 43.

Further, in the third embodiment of the present invention, laser beam may be irradiated on the surface of the wafer W from the light source 46. In case of irradiating the laser beam (having a relatively broad wavelength range) on the particles P adhered to the surface of the wafer W, a so-called radiation pressure is exerted on the particles P. Accordingly, the particles P move in the direction of the irradiation of the laser beam. Thus, the particles P can be more easily peeled off from the wafer W by the effect of the radiation pressure. However, since the effect of the radiation pressure is not great, it is preferable to adopt it as an auxiliary method in addition to another peeling-off step.

In accordance with third embodiment of the present invention, a particle inspection unit such as a surf scan may be used with a light irradiation unit. By using both the particle inspection unit and the light irradiation unit, light can be irradiated to only adhesion positions of particles P to apply micro-vibration to the particles P, so that adhesive strength of the particles P to the wafer W becomes weaker. Therefore, the consumption amount of energy can be reduced and the surface of the substrate can be cleaned while minimizing the effect of light irradiation.

Figure 5:
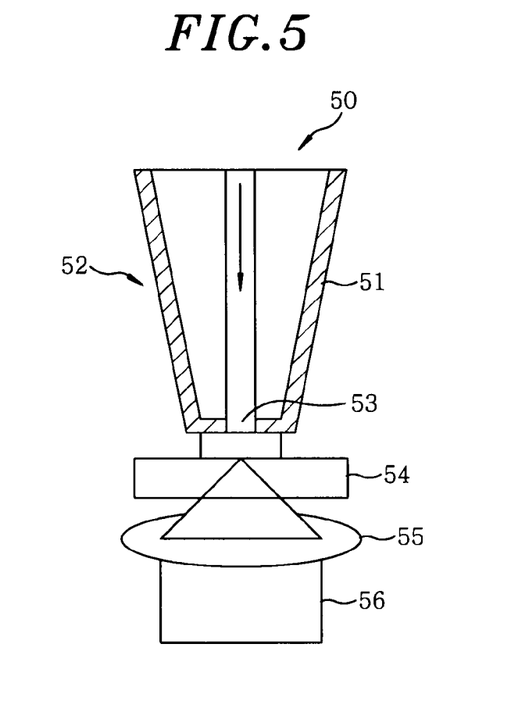
FIG. 5 shows a schematic configuration of a scanning near-field optical microscope (SNOM) in accordance with a fourth embodiment of the present invention.

FIG. 5 shows a schematic configuration of a scanning near-field optical microscope (SNOM) in accordance with a fourth embodiment of the present invention. The SNOM is a microscope for observing an object having a smaller size than the wavelength of the light.

As shown in FIG. 5, the SNOM 50 includes a probe 52 coated with a shading film 51, an opening 53 provided at the leading end of the probe 52, a sample 54 serving as a scattering material and facing the opening 53 at a distance of, e.g., 100 nm or less, and an condensing objective lens 55 facing the opening 53 of the probe 52 through the sample 54. When light is irradiated to the sample 54 through the opening 53, the light is scattered by the sample 54 and condensed by the condensing objective lens 55 to produce detection light 56. The diameter of the opening 53 provided at the leading end of the probe 52 is adjusted to be equal to or smaller than the wavelength of the irradiated light, e.g., 100 nmφ.

In case of irradiating light on the sample 54 through the opening 53 from the probe 52 by using the SNOM 50 having the above configuration, a near-field is formed on the sample 54 and the irradiated light acts on the sample 54 to create near-field light. Accordingly, an object having a smaller size than the wavelength of the irradiated light can be observed by measuring the created near-field light.

In this embodiment, light is irradiated on the wafer W by using the SNOM in order to observe the particles P adhered to the surface of the wafer W. When light is irradiated while scanning a certain range of the surface of the wafer W in order to observe the particles P, the particles P in the irradiation range are vibrated by the irradiated light. Accordingly, adhesive strength of the particles to the wafer W becomes weaker and the particles P are removed from the surface of the wafer W. Therefore, it is possible to remove particles P from the wafer W while observing the particles P adhered to the surface of the wafer W. The removed particles P are collected by a collecting plate facing the wafer W.

In accordance with the fourth embodiment of the present invention, the particles P are observed by scanning the surface of the wafer W and the observed particles P are vibrated by pinpoint irradiation of light. Accordingly, adhesive strength of the particles to the wafer W becomes weaker and the particles P are efficiently peeled off and removed from the wafer W. Therefore, the consumption amount of energy can be reduced and the effect of light irradiation can be minimized.

Further, a fifth embodiment of the present invention will be now described.

Figure 6:
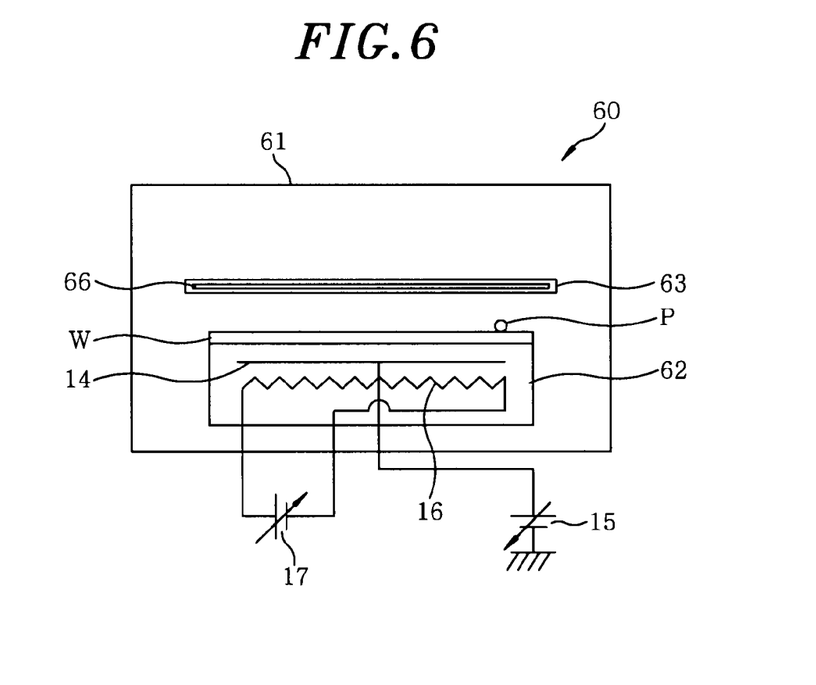
FIG. 6 shows a schematic configuration of a substrate cleaning apparatus in accordance with a fifth embodiment of the present invention.

FIG. 6 shows a schematic configuration of a substrate cleaning apparatus in accordance with the fifth embodiment of the present invention. As shown in FIG. 6, a substrate cleaning apparatus 60 is different from the substrate cleaning apparatus 10 of FIG. 1 in that the substrate cleaning apparatus 60 includes a cooling collecting plate 63 having therein a cooling unit, e.g., a peltier element 66.

In the substrate cleaning apparatus 60 having the above-described configuration, the wafer W serving as a target substrate is mounted on an upper surface of a mounting table 62, and an inner pressure of a processing chamber 61 is adjusted to, e.g., 1.3 kPa (10 Torr). Then, the wafer W is heated to, e.g., 150° C. by a heat transfer heater 16, and the cooling collecting plate 63 is set to about 0 to 20° C. Accordingly, a thermal stress and a thermophoretic force are exerted on the particles P adhered to the surface of the wafer W, and the particles P rise from the surface of the wafer W, so that the particles P can be easily peeled off from the surface of the wafer W. The particles P peeled off from the wafer W are collected by the cooling collecting plate 63.

In accordance with the fifth embodiment of the present invention, the cooling collecting plate 63 is used as a collecting plate. Accordingly, the thermophoretic force acting on the particles P becomes stronger. Therefore, the particles P can be more easily removed from the surface of the wafer W, and a removal ratio of the particles P can be improved as compared to the first embodiment of the present invention.

In the fifth embodiment of the present invention, the thermophoretic force affecting the particles P depends on a temperature gradient of an atmosphere surrounding the particles P. Accordingly, when the temperature of the wafer W is set to about 150° C. and the temperature of the cooling collecting plate 63 is set to, e.g., 0 to 20° C., the temperature gradient of the atmosphere surrounding the particles P increases as compared to, e.g., that in the first embodiment of the present invention. Accordingly, the thermophoretic force affecting the particles P becomes stronger, and the particles P can be more easily removed from the surface of the wafer W, and the cleaning efficiency can be improved. In this case, the thermophoretic force affecting the particles P also depends on a distance between the particles P and the cooling collecting plate 63. Accordingly, it is preferable to reduce the distance between the particles P and the coolant collecting plate 63, and the distance is set to, e.g., 1 mm.

Further, a sixth embodiment of the present invention will be now described.

Figure 7:
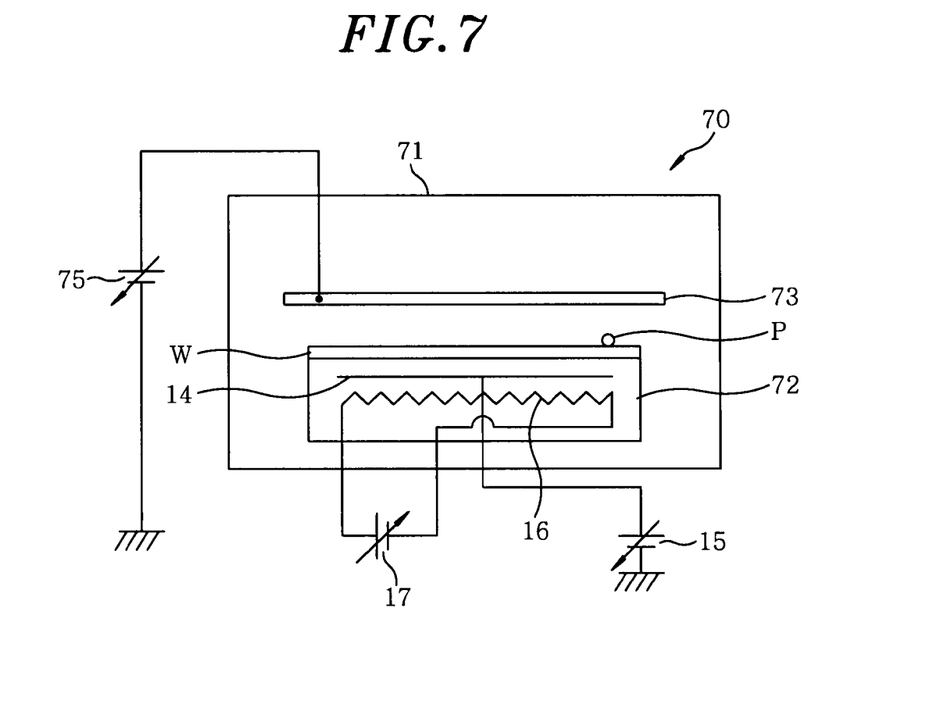
FIG. 7 shows a schematic configuration of a substrate cleaning apparatus in accordance with a sixth embodiment of the present invention.

FIG. 7 shows a schematic configuration of a substrate cleaning apparatus in accordance with the sixth embodiment of the present invention.

As shown in FIG. 7, a substrate cleaning apparatus 70 is different from the substrate cleaning apparatus 60 shown in FIG. 6 in that the substrate cleaning apparatus 70 includes a charging plate 73 instead of the cooling collecting plate 63. The charging plate 73 is charged positively or negatively, and a surface of a mounting table facing the charging plate 73, i.e., the wafer W is charged in opposition to the charging plate 73.

In the substrate cleaning apparatus 70 having the above-described configuration, the wafer W serving as a target substrate is mounted on an upper surface of the mounting table 72, and an inner pressure of a processing chamber 71 is adjusted to, e.g., 1.3 kPa (10 Torr). Thereafter, the wafer W is heated to, e.g., 150° C. by a heat transfer heater 16. Then, a thermal stress and a thermophoretic force are exerted on the particles P adhered to the surface of the wafer W, so that the particles P are peeled off from the surface of the wafer W and collected by the charging plate 73.

In accordance with the sixth embodiment of the present invention, the charging plate 73 is used as a collecting plate and is electrically connected to a DC power supply 75. The charging plate 73 is charged negatively and the surface of the wafer W (i.e., the particles P) is charged positively. Accordingly, an electrostatic force attracting the particles P to the charging plate 73 is exerted on the particles P which are peeled off from the surface of the wafer W. Thus, the peeling effect of the particles P and the particle collecting effect of the charging plate 73 can be improved, and the cleaning efficiency of the wafer W can be improved.

In the sixth embodiment of the present invention, preferably, the mounting table 72 and the charging plate 73 have opposite polarities to each other. Both the mounting table 72 and the charging plate 73 may be charged positively or negatively.

Further, a seventh embodiment of the present invention will be now described.

Figure 8:
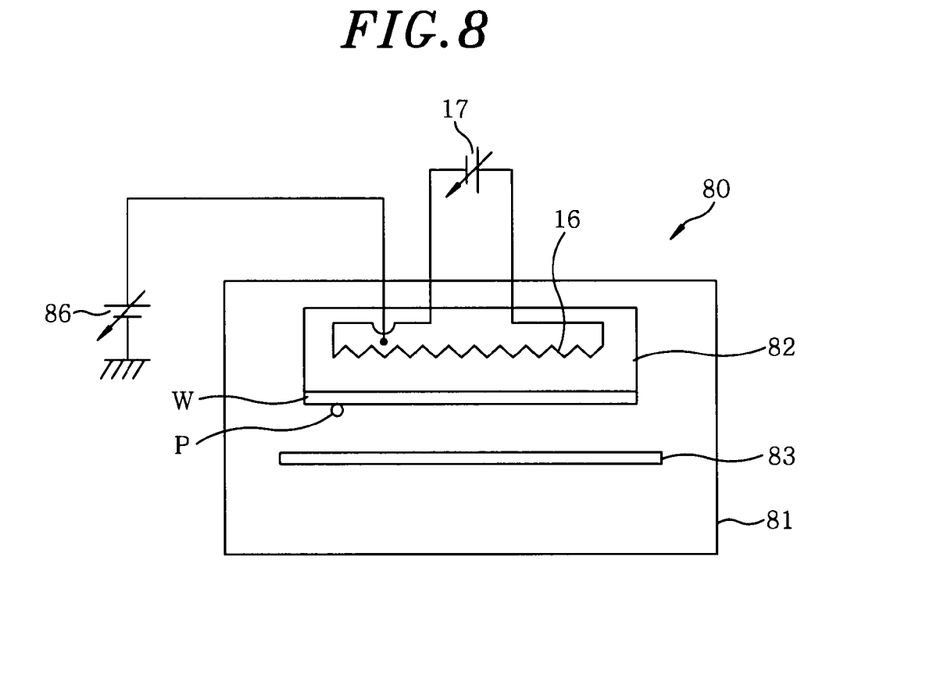
FIG. 8 shows a schematic configuration of a substrate cleaning apparatus in accordance with a seventh embodiment of the present invention.

FIG. 8 shows a schematic configuration of a substrate cleaning apparatus in accordance with a seventh embodiment of the present invention.

As shown in FIG. 8, a substrate cleaning apparatus 80 is different from the substrate cleaning apparatus 10 shown in FIG. 1 in that a mounting table 82 including a heat transfer heater 16 as a heating unit is installed upside down at a ceiling portion of a processing chamber 81, and the wafer W is fixed to a mounting surface facing a bottom surface of the processing chamber 81. The mounting table 82 is electrically connected to, e.g., a DC power supply 86. When a positive DC voltage is applied to a surface of the mounting table 82, a negative potential is generated on the surface of the wafer W facing the mounting table 82. Accordingly, a potential difference is created between the surface of the mounting table 82 and the surface of the wafer W. Therefore, the wafer W is attached to and held on the mounting surface of the mounting table 72 by a coulomb force or a Johnsen-Rahbek force due to the potential difference.

In the substrate cleaning apparatus 80 having the above-described configuration, the wafer W serving as a target substrate is attached to the surface of the mounting table 82, and an inner pressure of the processing chamber 81 is adjusted to, e.g., 1.3 kPa (10 Torr) by, e.g., a pressure control unit (not shown). Then, when the wafer W is heated to, e.g., 150° C. by the heat transfer heater 16, a thermal stress and a thermophoretic force are exerted on the particles P adhered to the surface of the wafer W, so that the particles P rise from the surface of the wafer W and can be easily peeled off from the surface of the wafer W. The particles P peeled off from the surface of the wafer W are collected by a collecting plate 83.

In accordance with the seventh embodiment of the present invention, the mounting table 82 is installed upside down at the ceiling portion of the processing chamber 81. Accordingly, the cleaning surface of the wafer W is directed downward and gravity is exerted on the particles P which are peeled off from the surface of the wafer W. Thus, the particle P can be more easily peeled off from the surface of the wafer W, and the cleaning efficiency can be improved. In addition, it is possible to prevent the particles P once peeled off from the surface of the wafer W from being adhered to the surface of the wafer W again.

In the embodiment of the present invention, the collection plate facing the mounting table in the processing chamber is used repeatedly. Accordingly, a regenerating process, i.e., a so-called self-cleaning step for cleaning and removing the particles P collected by the collecting plate is necessary.

As a cleaning method of the collecting plate, a liquid aerosol including steam, or a solid aerosol including $CO_2$ blast may be spread to a particle collecting surface of the collecting plate. Further, a particle adsorption sheet may be also attached to the particle collecting surface of the collecting plate and then detached therefrom, thereby removing the particles p. These particle removing methods may be used simultaneously.

In the embodiment of the present invention, the particles P adhered to a backside surface of the substrate whose surface has been cleaned may be also cleaned and removed by using the cleaning method of the collecting plate.

Figure 9:
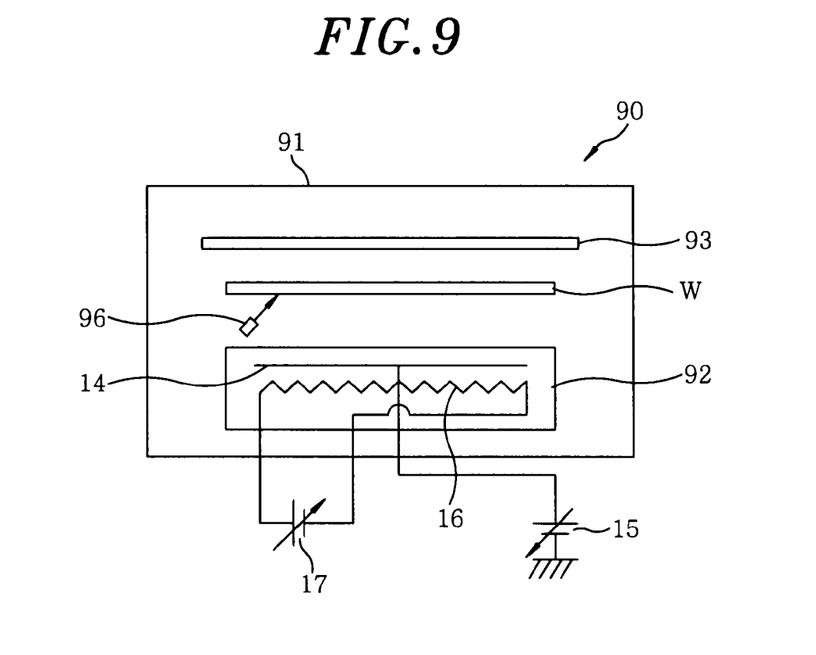
FIG. 9 shows a schematic configuration of a substrate cleaning apparatus in accordance with an eighth embodiment of the present invention.

FIG. 9 shows a schematic configuration of a substrate cleaning apparatus in accordance with an eighth embodiment of the present invention.

As shown in FIG. 9, a substrate cleaning apparatus 90 includes a processing chamber 91, a mounting table 92 provided at a bottom portion of the processing chamber 91, a collecting plate 93 arranged above a substrate mounting surface of the mounting table 92 to be separated therefrom by a predetermined distance, a wafer lifting unit (not shown) for lifting the wafer W from the surface of the mounting table 92, and a backside cleaning device 96 for cleaning a backside surface of the lifted wafer W. The mounting table 92 includes an electrostatic electrode plate connected to a DC power supply 15 and a heat transfer heater 16 connected to a DC power supply 17.

The wafer lifting unit lifts the wafer W from the surface of the mounting table 92 by using, e.g., pins, and holds an edge portion of the wafer W. The wafer lifting unit lifts the wafer W whose surface has been cleaned by a distance of, e.g., 5 to 100 mm from the surface of the mounting table 92. Thereafter, the backside surface of the wafer W is cleaned by the backside cleaning device 96.

For example, an aerosol cleaning device for spreading an aerosol to the backside surface of the wafer W after cleaning may be used as the backside cleaning device 96. The aerosol refers to fine liquid or solid particles suspended in a gas. For example, steam may be used as a liquid aerosol, and $CO_2$ blast may be used as a solid aerosol.

In the substrate cleaning apparatus 90 having the above-described configuration, the particles P adhered to the surface of the wafer W are cleaned and removed in the same manner as in the first embodiment of FIG. 1. Thereafter, the wafer lifting unit lifts the wafer W whose surface has been cleaned from the surface of the mounting table 92, and the aerosol cleaning is performed on the backside surface of the wafer W by using the backside cleaning device 96.

In accordance with the eighth embodiment of the present invention, the backside cleaning device 96 can clean the backside surface of the wafer W whose surface has been cleaned. Accordingly, the particles P adhered to the backside surface of the wafer W can be cleaned and removed. Therefore, it is possible to prevent the particles P adhered to the backside surface of the wafer W from being adhered to the surface of the wafer W again.

Figure 10:
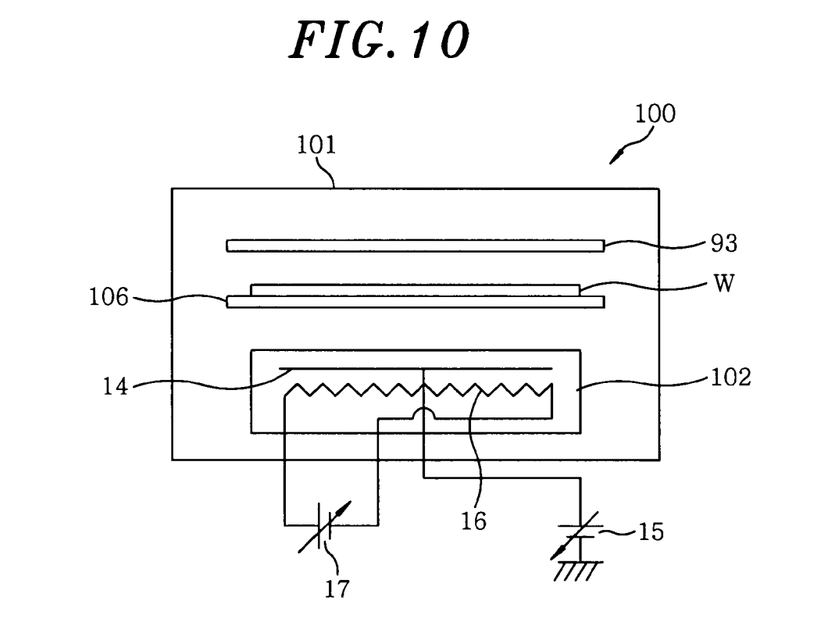
FIG. 10 shows a schematic configuration of a substrate cleaning apparatus in accordance with a ninth embodiment of the present invention.

FIG. 10 shows a schematic configuration of a substrate cleaning apparatus in accordance with a ninth embodiment of the present invention.

As shown in FIG. 10, a substrate cleaning apparatus 100 is different from the substrate cleaning apparatus 90 shown in FIG. 9 in that an attachment/detachment device (not shown) for attaching and detaching an adsorption sheet 106 is used as a backside cleaning device of the wafer W.

In the substrate cleaning apparatus 100 having the above-described configuration, in the same manner as in the eighth embodiment, the wafer W whose surface has been cleaned is lifted from the surface of the mounting table 102 by the wafer lifting unit. Then, for example, a polyimide film is attached to and detached from the backside surface of the wafer W by the attachment/detachment device (not shown), so that the particles P adhered to the backside surface of the wafer W are peeled off and removed.

In accordance with the ninth embodiment of the present invention, the attachment/detachment device is adopted as a backside cleaning device of the wafer W. Accordingly, the particles P adhered to the backside surface of the wafer W after cleaning the surface of the wafer W can be removed without the suspension of the particles P in an inner space of a processing chamber 101. Accordingly, it is possible to securely prevent the particles P from being adhered to the surface of the substrate again.

In the ninth embodiment of the present invention, the polyimide film is used as the adsorption sheet. However, the adsorption sheet may be any one capable of adsorbing and removing the particles without being limited to the polyimide film. Most of resin sheets may be used as the adsorption sheet in the ninth embodiment. An adhesive may be coated on the particle adsorption surface of the adsorption sheet, but the adhesive can be omitted. The particles P can be sufficiently attached and removed by using the generic characteristic of the resin sheet.

For example, a resist film coating/baking device using a spin coating method can be adopted as the attachment/detachment device of the adsorption sheet.

In the above-described embodiments of the present invention, the substrate to be cleaned is not limited to a wafer for semiconductor devices, and may be various substrates for a Liquid Crystal Display (LCD), Flat Panel Display (FPD) or the like, a photo mask, a CD substrate, a print substrate, or the like.

Further, characteristic configurations of the respective embodiments, for example, application of vibration to the wafer W via ultrasonic waves, application of vibration to the wafer W via light irradiation, use of a cooling plate for a collecting plate of foreign materials, use of a charging plate for a collecting plate of foreign materials, performance of a cleaning process on the wafer W which is arranged upside down and the like may be employed independently, or in combination.

The object of the present invention can be achieved, by providing a system or an apparatus with a storage medium storing program codes of software for executing the functions of the above-described embodiments, and reading and executing the program codes stored in the storage medium by the computer (or CPU, MPU, etc.) of the system or the apparatus.

In this case, the program codes themselves read from the storage medium achieve the functions of the above-described embodiments. The program codes and the storage medium storing the program codes are included in the present invention.

The storage medium for supplying the program codes may be, e.g., a floppy (registered trademark) disk, a hard disk, a magneto-optical disk, an optical disk such as a CD-ROM, a CD-R, a CD-RW, a DVD-ROM, a DVD-RAM, a DVD-RW, and a DVD+RW, a magnetic tape, a non-volatile memory card, a ROM, and the like. Further, the program codes may be downloaded through a network.

Besides, it is to be understood that the functions of the aforementioned embodiments may be accomplished not only by executing the program codes read out by the computer, but also by causing an OS (operating system) or the like that runs on the computer to perform a part or all of the actual operations based on instructions of the program codes.

Furthermore, it is to be understood that the functions of the aforementioned embodiments may also be accomplished by writing the program codes read out from the storage medium into a memory provided on a function extension board inserted into the computer or in a function extension unit connected to the computer, and then causing the CPU or the like provided on the function extension board or in the function extension unit to perform a part or all of the actual operations based on instructions of the program codes.

In accordance with a substrate cleaning method and a substrate cleaning apparatus of the present invention, the substrate may be heated to peel off the foreign materials adhered to the surface of the substrate from the surface of the substrate by a thermal stress, and the foreign materials may be removed from the surface of the substrate by a temperature gradient created in a proximity of the surface of the substrate. Then, the foreign materials removed from the surface of the substrate may be collected by a collecting unit facing the substrate. Accordingly, the foreign materials adhered to the surface of the substrate can be removed without a cleaning liquid dry process and it is possible to prevent pattern collapse due to a gas-liquid interface tension.

In accordance with the substrate cleaning method, in said heating and said collecting, a pressure of an atmosphere surrounding the substrate may range from $1.3 \times 10^2$ Pa (1 Torr) to 6.6 kPa (50 Torr). Accordingly, a thermophoretic force affecting the foreign materials gets stronger, and the peeling-off efficiency of the foreign materials can be improved.

In accordance with the substrate cleaning method, said heating may include vibrating the surface of the substrate by transmitting ultrasonic waves to the surface of the substrate. Accordingly, adhesive strength of the foreign materials to the substrate gets weaker, and the peeling-off efficiency of the foreign materials can be improved.

In accordance with the substrate cleaning method, said heating may include irradiating light to the surface of the substrate to vibrate the foreign materials adhered to the surface of the substrate by heat vibration or energy vibration of the light. Accordingly, adhesive strength of the foreign materials to the substrate gets weaker, and the peeling-off efficiency of the foreign materials can be improved.

In accordance with the substrate cleaning method, a scanning near-field optical microscope (SNOM) is used as a light irradiating apparatus. Accordingly, pin point cleaning can be executed by irradiating light while scanning a surface to be cleaned.

In accordance with the substrate cleaning method, the collecting unit may include a cooling plate and collect the foreign materials by a thermophoretic force due to a temperature gradient created between the substrate and the cooling plate. Accordingly, the temperature gradient between the surface of the substrate and the foreign material collecting unit gets larger, and the thermophoretic force affecting the foreign materials gets stronger. Thus, the foreign materials can be easily removed.

In accordance with the substrate cleaning method, the collecting unit may include a charging plate, and the charging plate and the surface of the substrate are charged to opposite polarities. Accordingly, the foreign materials peeled off from the surface of the substrate can be collected efficiently by an electrostatic force.

In accordance with the substrate cleaning method, said heating and said collecting may be performed while the surface of the substrate to be cleaned is directed vertically downward. Accordingly, gravity is exerted on the foreign materials peeled off from the surface of the substrate. Therefore, it is possible to prevent the foreign materials from being adhered to the surface of the substrate again.

In accordance with the substrate cleaning method, the method may further include cleaning foreign materials adhered to the collecting unit after cleaning the surface of the substrate. Accordingly, the foreign material collecting unit can be used repeatedly.

In accordance with the substrate cleaning method, the method may further include cleaning foreign materials adhered to a backside surface of the substrate after cleaning the surface of the substrate. Accordingly, it is possible to prevent the foreign materials removed from the surface of the substrate from being adhered to the backside surface of the substrate again.

In accordance with the substrate cleaning method, said cleaning foreign materials adhered to the collecting unit and said cleaning foreign materials adhered to a backside surface of the substrate may include spreading an aerosol to a surface to be cleaned or attaching and detaching an adsorption sheet to and from the surface to be cleaned, thereby peeling off the foreign materials from the surface to be cleaned. Accordingly, reuse of the foreign material collecting unit and cleaning of the backside surface of the substrate can be executed completely.

While the invention has been shown and described with respect to the embodiments, it will be understood by those skilled in the art that various changes and modification may be made without departing from the scope of the invention as defined in the following claims.

What is claimed is:

1. A substrate cleaning method by removing foreign materials adhered to a frontside and a backside surface of a substrate which is mounted on a mounting table by using a collecting unit facing the substrate, the collecting unit including a charging plate, the method comprising:

heating the substrate to peel off the foreign materials from the frontside surface of the substrate by a thermal stress;

charging the charging plate to a first polarity and charging the frontside surface of the substrate to a second polarity that is opposite to the first polarity;

removing the foreign materials from the frontside surface of the substrate by a temperature gradient created in a proximity of the frontside surface of the substrate and an electrostatic force exerted on the foreign materials;

collecting the foreign materials removed from the frontside surface of the substrate by the collecting unit;

lifting the substrate from a surface of the mounting table after removing the foreign materials adhered to the frontside surface of the substrate; and removing foreign materials adhered to the backside surface of the lifted substrate, wherein in said heating and said collecting, a pressure of an atmosphere surrounding the substrate is set to be greater than $1.3 \times 10^2$ Pa (1 Torr) and less than or equal to 6.6 kPa (50 Torr), and wherein the pressure of the atmosphere surrounding the substrate during said collecting is set to equal to that during said heating.

2. The method of claim 1, wherein said heating includes vibrating the frontside surface of the substrate by transmitting ultrasonic waves to the frontside surface of the substrate.

3. The method of claim 1, wherein said heating includes irradiating light to the frontside surface of the substrate to vibrate the foreign materials adhered to the frontside surface of the substrate by heat vibration or energy vibration of the light.

4. The method of claim 3, wherein the light is irradiated by using a scanning near-field optical microscope (SNOM).

5. The method of claim 1, wherein the collecting unit includes a cooling plate and collects the foreign materials by a thermophoretic force due to a temperature gradient created between the substrate and the cooling plate.

6. The method of claim 1, further comprising:

removing foreign materials adhered to the collecting unit after cleaning the frontside surface of the substrate.

7. The method of claim 6, wherein said removing foreign materials adhered to the collecting unit includes spreading an aerosol to a surface to be cleaned or attaching and detaching an adsorption sheet to and from the surface to be cleaned, thereby peeling off the foreign materials from the surface to be cleaned.

8. The method of claim 1, wherein said removing the foreign materials adhered to the backside surface of the substrate includes spreading an aerosol to the backside surface of the substrate, thereby peeling off the foreign materials from the backside surface of the substrate.

9. A substrate cleaning apparatus for removing foreign materials adhered to a frontside and a backside surface of a substrate, the apparatus comprising:

a mounting table, on which the substrate is mounted;

a heating unit configured to heat the substrate mounted on the mounting table to peel off the foreign materials from the frontside surface of the surface by a thermal stress and to remove the foreign materials from the frontside surface of the substrate by a thermophoretic force;

a foreign material collecting unit, which is arranged to face the mounting table, the foreign material collecting unit being configured to collect the foreign materials removed from the frontside surface of the substrate, the foreign material collecting unit including a charging plate, the charging plate and the frontside surface of the substrate being charged to opposite polarities;

a lifting unit configured to lift the substrate from a surface of the mounting table; and a backside cleaning device configured to remove foreign materials adhered to the backside surface of the substrate lifted by the lifting unit, wherein the substrate cleaning apparatus further comprises a CPU configured to set a pressure of an atmosphere surrounding the substrate to be greater than $1.3 \times 10^2$ Pa (1 Torr) and less than or equal to 6.6 kPa (50 Torr) during heating the substrate by using the heating unit and collecting the foreign materials removed from the substrate by using the foreign material collecting unit, and wherein the CPU is further configured to set the pressure of the atmosphere surrounding the substrate during said collecting equal to that during said heating.

10. The substrate cleaning apparatus of claim 9, wherein the backside cleaning device includes an aerosol cleaning device for spreading an aerosol to the backside surface of the substrate to peel off the foreign materials from the backside surface.

11. The substrate cleaning apparatus of claim 9, wherein the backside cleaning device includes an attachment/detachment device for attaching and detaching an adsorption sheet to and from the backside surface of the substrate to peel off the foreign materials from the backside surface.

12. The method of claim 1, wherein said removing the foreign materials adhered to the backside surface of the substrate includes attaching and detaching an adsorption sheet to and from the backside surface of the substrate, thereby peeling off the foreign materials from the backside surface of the substrate.

13. The method of claim 1, wherein, in said heating and said collecting, the pressure of the atmosphere surrounding the substrate is set to about 1.3 kPa (10 Torr).

14. The substrate cleaning apparatus of claim 9, wherein the pressure of the atmosphere surrounding the substrate is set to about 1.3 kPa (10 Torr) during said heating and said collecting.

* * * * *

UNITED STATES PATENT AND TRADEMARK OFFICE
CERTIFICATE OF CORRECTION

PATENT NO. : 8,475,602 B2
APPLICATION NO. : 12/604686
DATED : July 2, 2013
INVENTOR(S) : Hidefumi Matsui et al.

Page 1 of 1

It is certified that error appears in the above-identified patent and that said Letters Patent is hereby corrected as shown below:

On the title page, Item (73), the Assignee's Information is incorrect. Item (73) should read:

--(73) Assignee: Tokyo Electron Limited, Tokyo (JP)--

Signed and Sealed this
Third Day of September, 2013

Teresa Stanek Rea
*Acting Director of the United States Patent and Trademark Office*